United States Patent [19]

Kyomasu et al.

[11] 4,233,616
[45] Nov. 11, 1980

[54] SEMICONDUCTOR NON-VOLATILE MEMORY

[75] Inventors: Mikio Kyomasu; Yoshiharu Nakao, both of Itami, Japan

[73] Assignee: Mitsubishi Denki Kabushiki Kaisha, Tokyo, Japan

[21] Appl. No.: 910,950

[22] Filed: May 30, 1978

[30] Foreign Application Priority Data

Jun. 8, 1977 [JP] Japan .................................. 52-68217

[51] Int. Cl.² ............................................. H01L 29/78
[52] U.S. Cl. ...................................... 357/23; 357/13; 357/4
[58] Field of Search .......................... 357/23, 41, 13, 4

[56] References Cited

U.S. PATENT DOCUMENTS

| | | | |
|---|---|---|---|
| 4,014,036 | 3/1977 | Ho | 357/24 |
| 4,054,895 | 10/1977 | Ham | 357/23 |
| 4,057,820 | 11/1977 | Gallagher | 357/23 |
| 4,135,929 | 1/1979 | Breus | 29/571 |
| 4,142,926 | 3/1979 | Morgan | 148/187 |

*Primary Examiner*—Martin H. Edlow
*Attorney, Agent, or Firm*—Wenderoth, Lind & Ponack

[57] ABSTRACT

In the disclosed FAMOS semiconductor non-volatile memory a source and a drain region of the p+ type are disposed in an n semiconductor layer to form a gate region between them. The main face of the semiconductor layer is coated with a silicon dioxide film in which a polycrystalline silicon gate is buried to bridge the source and drain regions. An n+ type high doped semiconductor region is disposed in the semiconductor layer only under the silicon gate to form a pn junction with the drain region. Thus the pn junction is normal to the main face of the semiconductor layer.

6 Claims, 3 Drawing Figures

SEMICONDUCTOR NON-VOLATILE MEMORY

BACKGROUND OF THE INVENTION

This invention relates to a semiconductor non-volatile memory and more particularly to a floating gate avalanche injection type metal-oxide-semiconductor memory with improved writing characteristics.

Metal-oxide-semiconductor (which is abbreviated to an "MOS") type semiconductor non-volatile memories are sorted into the floating gate avalanche injection MOS type memories having a floating gate in each memory cell and the metal nitride oxide semiconductor type memories having a gate insulating film with a double layer structure in each memory cell. Those two types of memories are abbreviated as "FAMOS" and "MNOS" respectively. In the FAMOS type, the memory cell has an operating mechanism by which a trap for accumulating electric charge is located in a band of the floating gate, while in the MNOS type the trap is located at a boundary level formed between a pair of electrically insulating films formed of dissimilar materials. The generation of hot carriers for storing information relies upon avalanche breakdown.

The semiconductor non-volatile memory of the type referred to forms a read only memory (which is abbreviated as "ROM") which is one of the elements included in microprocessors, microcomputers etc. A random access memory (which is abbreviated as "RAM") is used for writing and reading and is required to be operative at a higher speed and at a higher packing density. In order to attain the high speed operation, it is desirable to increase the conductance of the MOS transistors forming the selective gate unit of these memories. To this end, it is desirable to decrease both the threshold voltage $V_{TH}$ and the body effect constant K provided that the normalized size effect is considered.

On the other hand, an increase in degree of integration requires both a double layer structure of memory cells and a decrease in spacing between the source and drain regions in the MOS structure. To prevent a decrease in the punch-through voltage caused by this decrease in source-to-drain spacing then it is necessary to increase the impurity concentration of the semiconductor substrates. However, this increase in impurity concentration causes problems because both the body effect constant K, and the threshold voltage $V_{TH}$ described above increase to impede the high speed operation.

In order to solve those problems, there have been already proposed MOS type semiconductor non-volatile memories including a semiconductor substrate and a semiconductor region for each memory cell identical in conductivity type to the semiconductor substrate and higher in impurity concentration than the semiconductor substrate with a junction formed between that region and the drain region involved. In those MOS semiconductor non-volatile memories, the junction between the high impurity concentration region and the drain region extends outside of the associated gate region and therefore the writing avalanche breakdown current does not greatly contribute to the storing action as compared with memories not including the high impurity concentration region.

Accordingly, it is an object of the present invention to provide a new and improved semiconductor non-volatile memory capable of attaining both high speed operation and high packing density while efficiently storing data with a low writing voltage.

SUMMARY OF THE INVENTION

The present invention provides a semiconductor non-volatile semiconductor memory cell comprising a semiconductor layer of one type conductivity, a pair of semiconductor regions of the opposite type conductivity disposed in a spaced relationship in the semiconductor layer to form a gate region therebetween, an electrically insulating film disposed on the gate region, and a highly doped semiconductor region disposed to form a junction with at least one of the pair of semiconductor regions of the opposite type conductivity, the junction being located only within the gate region, the memory element performing a storing operation by having an electric charge accumulated in the electrically insulating film.

Preferably, a floating gate is buried in the electrically insulating film and the electric charge is accumulated in the floating gate.

Advantageously, a drain region is formed of the semiconductor region with the opposite type conductivity which forms a pn junction with the highly doped region, and a source region is formed other of the semiconductor region having the opposite type conductivity.

BRIEF DESCRIPTION OF THE DRAWING

The present invention will become more readily apparent from the following detailed description taken in conjunction with the accompanying drawings in which.

DESCRIPTION OF THE PREFERRED EMBODIMENTS

Figure 1:
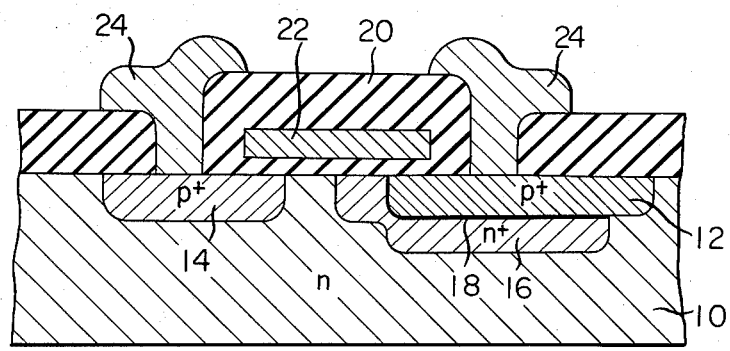
FIG. 1 is a fragmental cross sectional view of a p channel FAMOS semiconductor non-volatile memory cell constructed in accordance with the principles of the prior art.

For a better understanding of the nature of the present invention, a conventional FAMOS semiconductor non-volatile memory cell will now be described in conjunction with FIG. 1. The arrangement illustrated is a p channel MOS transistor structure and comprises an n type semiconductor substrate 10, and a pair of p+ type diffusion regions 12 and 14 disposed in a spaced relationship in the surface portion of the substrate 10. In the example illustrated, the diffusion region 12 forms a drain region while the diffusion region 14 forms a source region. The arrangement further comprises an n+ type avalanche diffusion layer 16 disposed to form a pn junction 18 with the p+ type drain region 12, an electrically insulating film 20 formed, for example, of silicon dioxide and disposed on the surface of the substrate 10, and a polycrystalline silicon gate 22 buried in the electrically insulating film 20 to overlap both diffusion regions 12 and 14.

Then a pair of aluminum wires 24 are disposed on the electrically insulating film 20 and extend through respective windows disposed in the latter until they are disposed in ohmic contact with the respective p+ type diffusion regions 12 and 14.

In this way the basic structure of a memory cell has been produced.

The substrate 10 has a low impurity concentration of from $10^{14}$ to $10^{15}$ atoms per cubic centimeter for the purpose of decreasing both the threshold voltage $V_{TH}$ and the body effect constant K thereof. This results in a decrease in the punch-through voltage but the provision of the n+ type avalanche diffusion region 16 causes a decrease in the writing voltage to thereby operate the arrangement satisfactorily even with a decreased punch-through voltage.

In order to manufacture the arrangement of FIG. 1, it is a common practice to first form the n+ type semiconductor regions 16 in the semiconductor substrate 10 by selectively diffusing the n type conductivity impurity phosphorus into the substrate 10 and then form the source and drain diffusion regions 14 and 12 respectively by selectively diffusing the p type conductivity impurity boron into the substrate 10.

However, in the manufacturing process as described above, the phosphorus in the n+ type semiconductor region 16 is again diffused into the substrate 10 upon forming the source and drain diffusion regions 14 and 12 respectively and also upon forming the silicon dioxide films 20 to deepen the diffusion depth of the n+ type regions 16 more than the source and drain regions 12 and 14 respectively due to the boron as shown in FIG. 1. This is also because phosphorus has a diffusion coefficient larger than that of boron. As a result, the junction 18 formed between the n+ type region and the drain region 12 is present not only below the polycrystalline silicon gate 22, that is, in the gate region defined between the two regions 12 and 14 but also partly extended under the drain region 12 as shown in FIG. 1.

Accordingly, in the arrangement of FIG. 1 that portion of the junction 18 located adjacent to the polycrystalline silicon gate 22 which contributes to the storing operation is only one portion of the entire junction. Consequently, the writing avalanche breakdown current does not greatly contribute to the storing operation performed by the memory cell shown in FIG. 1.

In view of the abovementioned characteristics, the present invention has been completed and contemplates providing a semiconductor non-volatile memory including the junction 18 extending only within the gate region for each memory element to permit the avalanche breakdown current to contribute effectively to the storing operation.

Figure 2:
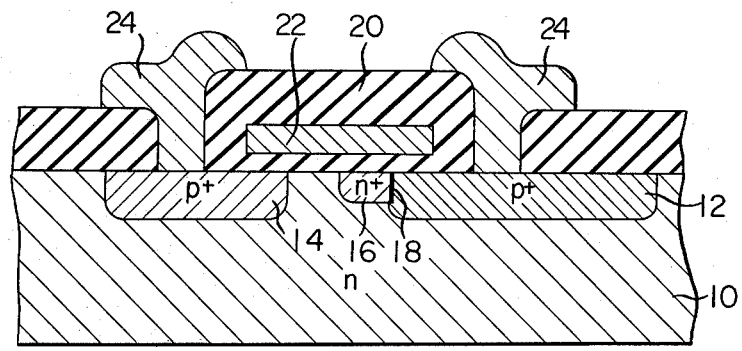
FIG. 2 is a fragmental cross sectional view of a p channel FAMOS semiconductor non-volatile memory cell constructed in accordance with the principles of the present invention.

Referring now to FIG. 2 wherein like reference numerals designate components identical to or corresponding to those shown in FIG. 1, there is illustrated one memory cell of a p channel FAMOS semiconductor non-volatile memory constructed in accordance with the principles of the present invention. The arrangement illustrated is different from that shown in FIG. 1 only in that in FIG. 2 the junction 18 is disposed only within the gate region.

In order to manufacture the memory shown in FIG. 2, one main face of an n type silicon layer such as the substrate 10 having an impurity concentration of from $10^{14}$ to $10^{15}$ atoms per cubit centimeter is selectively oxidized in a predetermined pattern to expose operative regions thereof to form field oxide films thereon. Then an ion implantation technique is used to implant arsenic ions into a predetermined portion of each of the operative regions to a depth of 0.2 $\mu$m to form the n+ type region 16 having an impurity concentration of $10^{17}$ atoms per cubic centimeter.

Following this, a gate oxide film is formed on each of the operative regions in the manner well known in the art and then a polycrystalline silicon gate 22 is formed on that gate oxide film so as to include one portion spreading over the n+ type region 16.

Thereafter, the silicon gate 22 is used as a mask to selectively diffuse boron into the substrate 10 to form in each of the operative regions a pair of p+ type source and drain diffusion regions 14 and 12 respectively each having an impurity concentration of from $10^{20}$ to $10^{22}$ atoms per cubic centimeter and a diffusion depth of from 1.0 to 1.5 $\mu$m.

Subsequently, an oxide film is formed to bury the polycrystalline silicon gate 22 into a unitary structure including the oxide film previously formed and that formed now in a manner well known in the art.

Then aluminum wires 24 are disposed in pairs on the oxide films 20 and also disposed in ohmic contact with the associated source and drain regions 14 and 12 respectively in a manner also well known in art.

Note that, upon forming the source and drain regions 14 and 12 respectively and also upon forming the oxide films 20, the n+ type region 16 is driven but the arsenic located in that region is scarcely diffused into the adjacent portion of the semiconductor layer 10. Thus the depth of the n+ type region 16 can be shallower than that of the drain region 12. As a result, the junction 18 between the two regions 12 and 16 is located only below the polycrystalline silicon gate 22 and within the gate region as shown in FIG. 2.

From the foregoing it is seen that in the arrangement of FIG. 2 the application of a writing voltage to the drain region 12 causes the avalanche breakdown to be concentrated below the polycrystalline silicon gate 22 with the result that hot electrons generated due to that avalanche breakdown are efficiently accumulated on the polycrystalline silicon gate 22.

Figure 3:
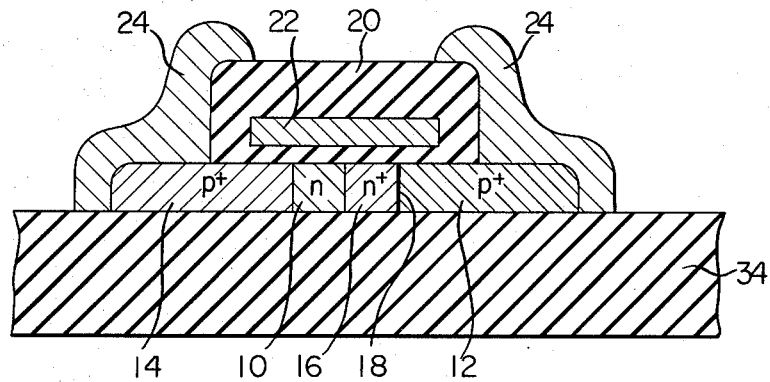
FIG. 3 is a view similar to FIG. 2 but illustrating a modification of the present invention.

In a modification of the present invention shown in FIG. 3 wherein like reference numerals designate components identical to or corresponding to those shown in FIG. 1 or 2, an n type silicon layer 10 is epitaxially grown on an electrically insulating substrate 34 of sapphire to be about 0.6 $\mu$m thick. Then a manufacturing process similar to that described above in conjunction with FIG. 2 is repeated with the epitaxially grown semiconductor layer 10 thereby forming an FAMOS semiconductor memory cell as shown in FIG. 3.

In the arrangement of FIG. 3, the diffusion regions 12, 14 and 16 have a common depth limited by the thickness of the epitaxially grown silicon layer 10. Therefore the junction 18 is formed between the p+ type drain region 12 and the n+ type diffusion region 16 below the polycrystalline silicon gate 22 only even if phosphorus is diffused into the semiconductor layer 10 to form the n+ type region.

From the foregoing it is seen that, in MOS semiconductor non-volatile memories performing a storing operation by accumulating an electric charge in an electrically insulating film portion underlaid with the gate region of each MOS memory cell, the present invention discloses the junction formed between the semiconductor region to which the writing voltage is applied and the highly doped region provided for lowering the writing voltage is located only within the gate region formed between two regions in each memory cell. Therefore the avalanche breakdown current effectively contributes to the storing operation performed by the resulting semiconductor non-volatile memory which is also advantageous in that the writing voltage can be lowered and the efficiency is high.

While the present invention has been illustrated and described in conjunction with a few preferred embodiments thereof it is to be understood that numerous changes and modifications may be resorted to without departing from the spirit and scope of the present invention. For example, the present invention is equally applicable to n channel MOS transistor structures and MNOS memories. Also, the semiconductor non-volatile memory of the present invention may be produced by properly selecting the ratio of diffusion concentration between the source and drain diffusion regions and the n+ type diffusion region to increase the dimension of each of the former regions as compared with the latter region.

What we claim is:

1. A semiconductor non-volatile memory unit composed of at least one memory cell comprising a semiconductor layer of a first type conductivity, said memory cell having a separately provided pair of semiconductor regions of the opposite type conductively disposed in a spaced relationship with at least a portion of said semiconductor layer therebetween to form a gate region therebetween, an electrically insulating film disposed on said gate region for performing a storing operation by having an electric charge accumulated therein, and means for providing a pn junction with only one of said pair of semiconductor layers and for providing no pn junction with the other of said pair of semiconductor layers, said means comprising a separately provided single highly doped semiconductor region of the first conductivity type disposed to form said pn junction with one of said pair of semiconductor regions and to be separate from the other of said pairs of semiconductor regions, said pn junction being located only within said gate region.

2. A semiconductor non-volatile memory cell as claimed in claim 1 further comprising a pair of electrodes, each electrode disposed in ohmic contact with a respective one of said pair of semiconductor regions of the opposite type conductivity.

3. A semiconductor non-volatile memory cell as claimed in claim 1 wherein a floating gate is buried in said electrically insulating film and said electric charge is accumulated in said floating gate.

4. A semiconductor non-volatile memory cell as claimed in claim 1 wherein a drain region is formed of said semiconductor region with the opposite type conductivity forming said pn junction with said highly doped semiconductor region, and a source region is formed of the other semiconductor region having the opposite type conductivity.

5. A semiconductor non-volatile memory cell as claimed in claim 1 wherein said pair of semiconductor regions having the opposite type conductivity are doped with boron and said highly doped semiconductor region includes arsenic.

6. A semiconductor non-volatile memory cell as claimed in claim 1 wherein said semiconductor layer of the one type conductivity is epitaxially grown on a sapphire substrate.

* * * * *